United States Patent
Tomohiro

(10) Patent No.: US 9,362,194 B2
(45) Date of Patent: Jun. 7, 2016

(54) SEMICONDUCTOR CHIP COVERED WITH SEALING RESIN HAVING A FILLER MATERIAL

(71) Applicant: Micron Technology, Inc., Boise, ID (US)

(72) Inventor: Atsushi Tomohiro, Akita (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/711,138

(22) Filed: May 13, 2015

(65) Prior Publication Data

US 2015/0332986 A1 Nov. 19, 2015

(30) Foreign Application Priority Data

May 14, 2014 (JP) .................................. 2014100176

(51) Int. Cl.
*H01L 23/48* (2006.01)
*H01L 21/00* (2006.01)
*H01L 23/31* (2006.01)
*H01L 23/00* (2006.01)
*H01L 25/065* (2006.01)
*H01L 21/56* (2006.01)
*H01L 23/495* (2006.01)

(52) U.S. Cl.
CPC .......... *H01L 23/3107* (2013.01); *H01L 21/561* (2013.01); *H01L 23/495* (2013.01); *H01L 24/17* (2013.01); *H01L 24/49* (2013.01); *H01L 25/0657* (2013.01); *H01L 23/3185* (2013.01); *H01L 24/29* (2013.01); *H01L 2924/1517* (2013.01); *H01L 2924/186* (2013.01)

(58) Field of Classification Search
CPC .............. H01L 23/295; H01L 23/3107; H01L 23/3185; H01L 21/561; H01L 24/29; H01L 24/17
See application file for complete search history.

(56) References Cited

U.S. PATENT DOCUMENTS

| 7,683,485 B2* | 3/2010 | Nikaido ............ H01L 23/49816 257/738 |
| 7,893,525 B2* | 2/2011 | Iida ..................... B81C 1/00238 257/415 |
| 2002/0056906 A1* | 5/2002 | Kajiwara .............. H01L 21/565 257/692 |
| 2006/0091523 A1* | 5/2006 | Shimanuki ........ H01L 23/49816 257/698 |
| 2008/0217774 A1* | 9/2008 | Nikaido ............ H01L 23/49816 257/738 |
| 2008/0251904 A1* | 10/2008 | Theuss .................. H01L 21/563 257/679 |
| 2011/0260337 A1 | 10/2011 | Handa |
| 2015/0243881 A1* | 8/2015 | Sankman .............. H01L 23/295 361/679.55 |

FOREIGN PATENT DOCUMENTS

JP 2011228603 A 11/2011

* cited by examiner

*Primary Examiner* — Alonzo Chambliss
(74) *Attorney, Agent, or Firm* — Perkins Coie LLP

(57) ABSTRACT

A semiconductor device includes a wiring substrate, a sealing resin layer formed on the wiring substrate out of a filler-containing resin and having a one-sided filler content ratio, and at least one semiconductor chip mounted on the wiring substrate such that the semiconductor chip is located offset to be closer to an area where the filler content ratio is relatively low in the sealing resin layer and is sealed in its offset location in the sealing resin layer.

20 Claims, 14 Drawing Sheets

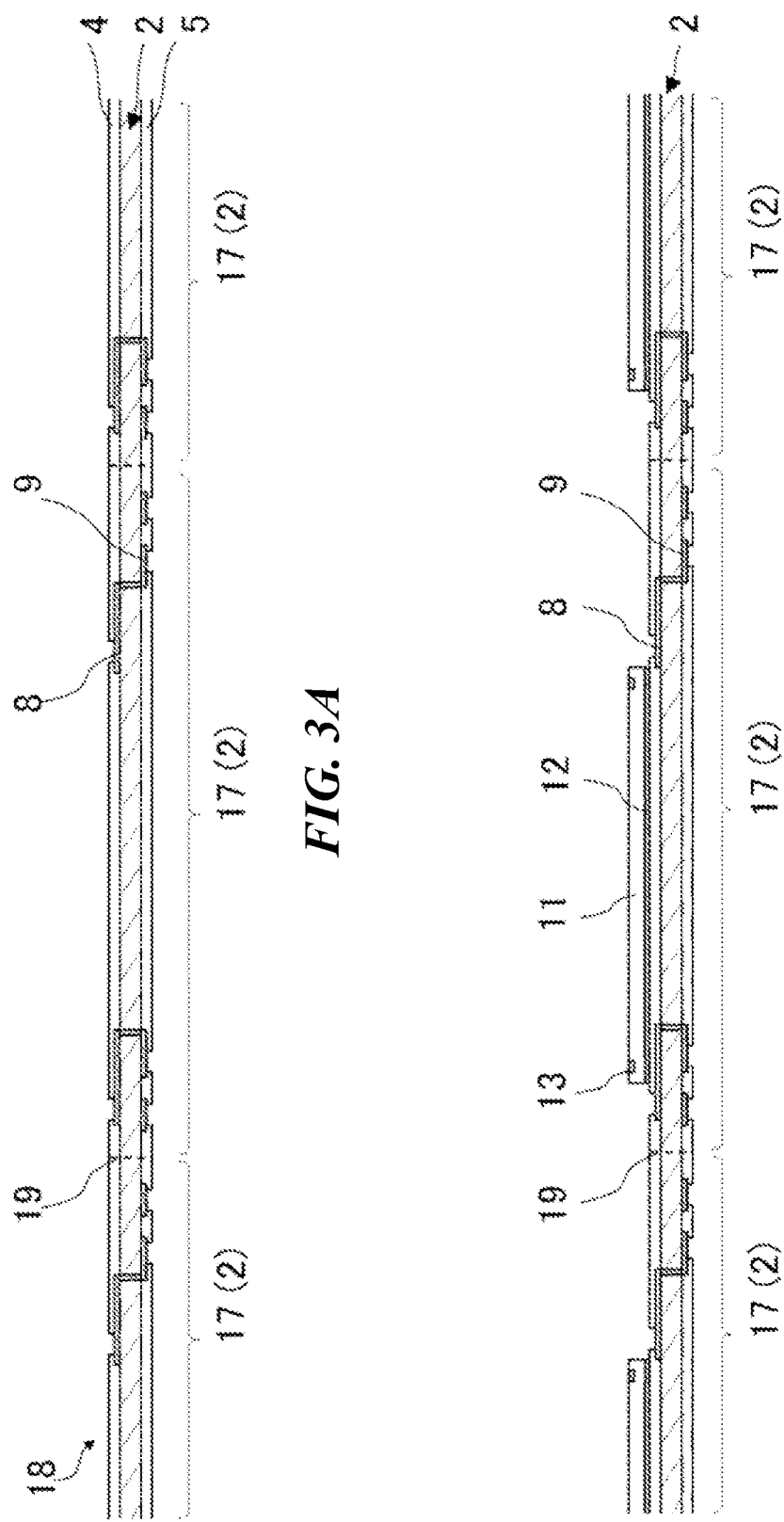

SEMICONDUCTOR CHIP COVERED WITH SEALING RESIN HAVING A FILLER MATERIAL

CROSS-REFERENCE TO RELATED APPLICATION

This application is based upon and claims the benefit of priority from Japanese Patent Application No. 2014-100176, filed on May 14, 2014, the disclosure of which is incorporated herein in its entirety by reference.

BACKGROUND OF THE INVENTION

1. Field of the Invention

The present invention relates to a semiconductor device, and more particularly to such a device having a semiconductor chip which is covered with a sealing resin. The present invention may also relate to a method of manufacturing such a device.

2. Background

In recent years, the miniaturization of portable devices has led to a demand for a reduction in the size and thickness of semiconductor devices incorporated in the portable devices. For example, a BGA (Ball Grid Array) type semiconductor device has become less rigid as its wiring substrate and semiconductor chips get thinner and thinner. As a result, a warpage of the semiconductor device caused by the effect of a sealing resin has grown into a serious problem.

In general, the BGA type semiconductor device is sealed with a filler-containing resin in the following manner. A wiring substrate having multiple product regions is clamped with a molding die, and a melted sealing resin is so injected into a cavity of the molding die by a transfer molding method that the sealing resin proceeds from the gate side to the air-vent side to form a sealing resin layer covering the whole of multiple product regions.

Japanese Laid-Open Patent Publication No. 2011-228603 discloses a configuration in which a semiconductor chip is bonded to a wiring substrate such that the semiconductor chip is located offset to the center of the wiring substrate and closer to the air-vent side and is sealed with a filler-containing resin.

An analysis made by the inventor of the present invention has led to the following analytical results.

A sealing resin layer sealing a semiconductor chip usually contains a filler. As a result, when the sealing resin layer is formed by the transfer molding method, a difference in content ratio of the filler to the resin (filler content ratio) is created between the gate side, to which the sealing resin is supplied, and the air-vent side, from which air is discharged, in the sealing resin layer. Specifically, in the sealing resin layer, the air-vent side of the sealing resin becomes larger in filler content ratio than the gate side of the sealing resin.

A linear expansion coefficient distribution in the sealing resin layer changes depending on a filler content ratio distribution in the sealing resin layer. Specifically, in the sealing resin layer, the filler content is smaller than the resin content on the gate side where the resin volume turns out to be greater and therefore a linear expansion coefficient becomes larger, while the filler content is larger than the resin content on the air-vent side where the resin volume turns out to be smaller and therefore a linear expansion coefficient becomes smaller. Such a difference in linear expansion coefficient leads to a phenomenon that the semiconductor device and the wiring substrate warp inward on the gate side and outward on the air-vent side. As a result, the semiconductor device may become inferior in mountability.

Japanese Laid-Open Patent Publication No. 2011-228603 discloses the configuration in which the semiconductor chip is mounted and sealed in the offset location closer to the air-vent side on the wiring substrate. By mounting the semiconductor chip in the offset location closer to the air-vent side where the filler content ratio is high in this manner, the resin volume on the gate side is increased as the same on the air-vent side is decreased in the sealing resin layer. This leads to a growing warpage of the semiconductor device.

BRIEF DESCRIPTION OF THE DRAWINGS

FIG. 3A to 3F are process drawings for explaining a flow of assembling the semiconductor device according to a first embodiment;

DETAILED DESCRIPTION OF THE EMBODIMENTS

This invention will be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
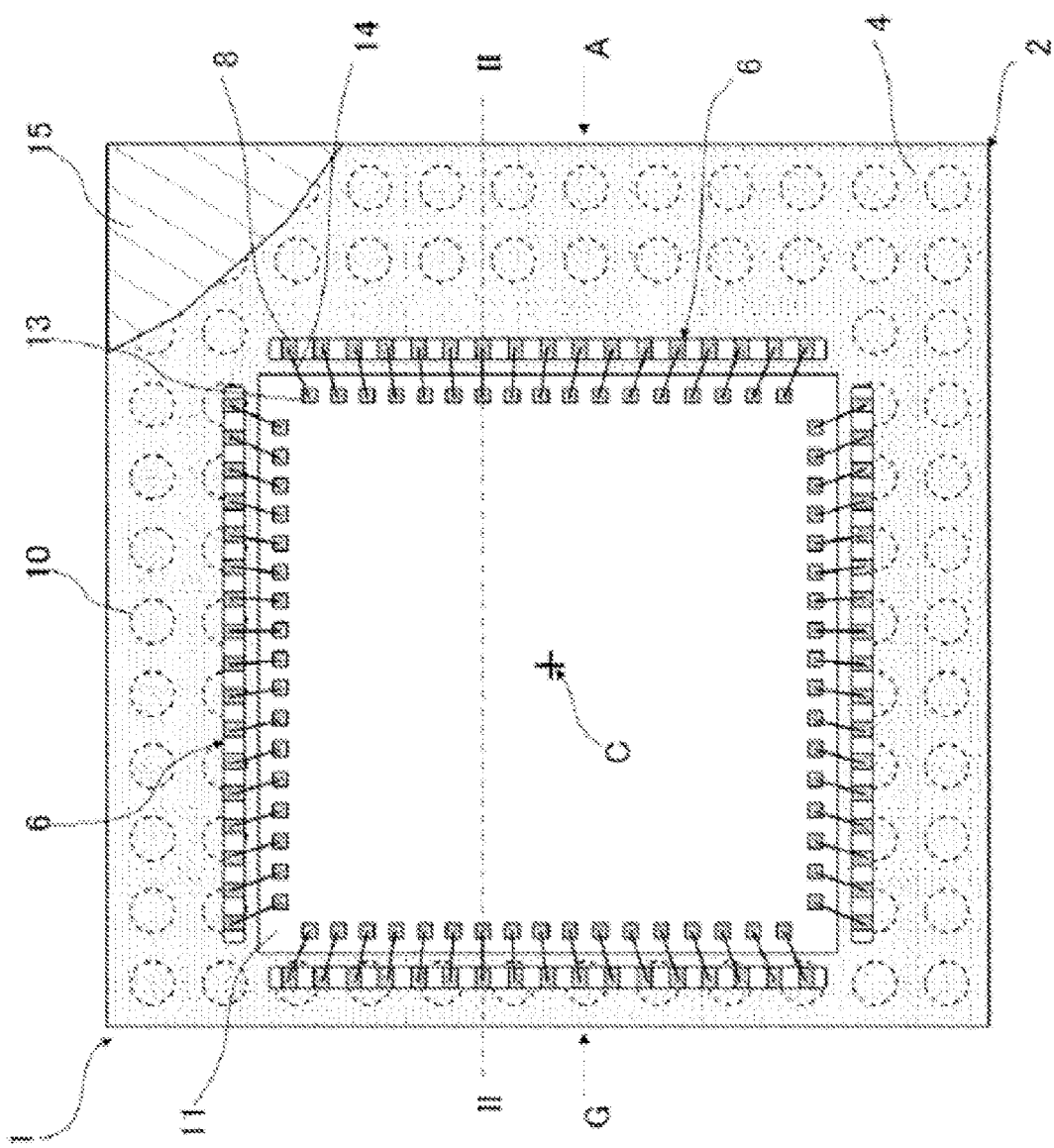
FIG. 1 is a plan view of a schematic configuration of a semiconductor device according to a first embodiment.
Figure 2:
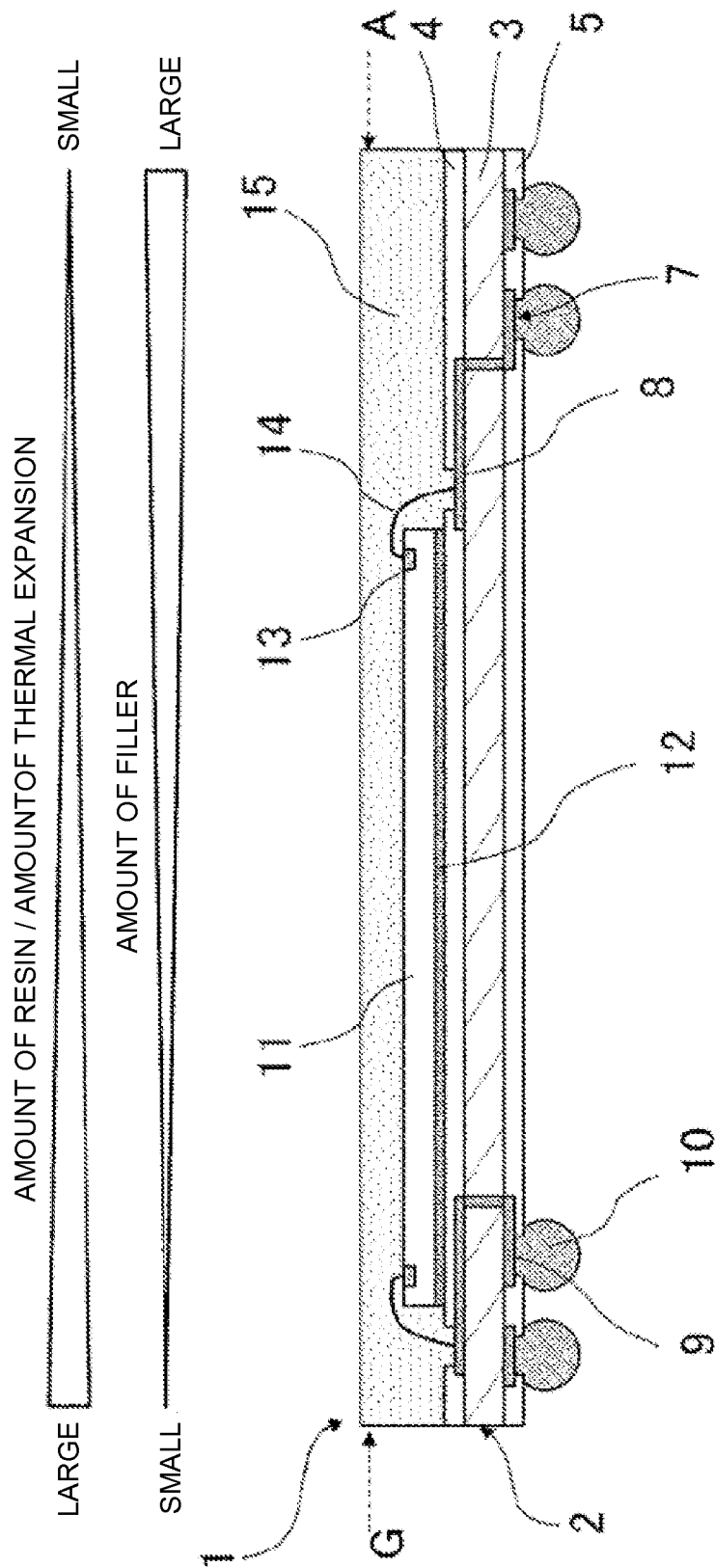
FIG. 2 is a sectional view along II-II line of FIG. 1.

As shown in FIGS. 1 and 2, a semiconductor device 1 includes a wiring substrate 2, a sealing resin layer 15 formed on the wiring substrate 2 out of a filler-containing resin and having a one-sided filler content ratio (a filler content against a resin content varies depending on locations and areas on the wiring substrate 2), and at least one semiconductor chip 11 mounted on the wiring substrate 2 such that the semiconductor chip 11 is located offset to be in an area in which the filler content ratio in the sealing resin layer 15 is relatively low and is sealed in its offset location in the sealing resin layer 15.

The semiconductor chip 11 is mounted on the wiring substrate 2 such that the semiconductor chip 11 is located offset to the center of the wiring substrate 2 where the filler content ratio is relatively high and closer to an end of the wiring substrate 2 where the filler content ratio is relatively low (closer to an end side on the gate G side) and is sealed in its offset location.

The sealing resin layer 15 can be formed by, for example, a transfer molding method according to which a filler-containing resin is supplied, i.e., pressure-transferred to one side (gate side A) and air is discharged from the other side (air-vent side). As a result of differences between the filler and the resin in their physical properties, shapes, and flowabilities affected by the physical properties and shapes, an area in which the filler content ratio is relatively low is formed on the one side, i.e., pressure-transfer side (gate side G), while an area in which the filler content ratio is relatively high is formed on the other side, i.e., air-discharge side (air-vent side A) in an inevitable manner. To deal with this problem, the semiconductor chip 11 is mounted on the wiring substrate 2 such that the center C of the semiconductor chip 11 is located offset to the center of the wiring substrate 2 and closer to the area on the gate G side in which the filler content ratio is relatively low.

Offset mounting of the semiconductor chip 11 relatively increases a chip occupation rate in the area on the gate G side in which the filler content ratio is relatively low on the wiring substrate 2 and in the sealing resin layer 15. As a result, a space available for wire arrangement, etc., increases relatively in the area on the air-vent side A in which the filler content ratio is relatively high. It is therefore preferable that the semiconductor chip 11 be disposed such that its side carrying electrode pads 13 in greater number is faced to the area (air-vent side A) where filler content ratio is relatively high.

Components of the BGA type semiconductor device 1 will hereinafter be described in detail.

The wiring substrate 2 is, for example, of an almost rectangular plate-like shape and is approximately 90 μm in thickness. The wiring substrate 2 is constructed by, for example, forming given wiring patterns made of Cu, etc., on both surfaces of a dielectric substrate 3, which is a glass epoxy substrate, etc.

On both surfaces of the wiring substrate 2, first and second dielectric films 4 and 5 made of a solder resist, etc., are formed, respectively. The above given wiring patterns, except a part thereof, are covered with the first and second dielectric films 4 and 5. The first dielectric film 4 has multiple first openings 6, and the second dielectric film 5 has multiple second openings 7. On the given wiring patterns, portions exposed through the multiple first openings 6 make up multiple connection pads 8 while portions exposed through the multiple second openings 7 make up multiple lands 9. The multiple connection pads 8 are electrically connected to the corresponding multiple lands 9 via the given wiring patterns. To the multiple lands 9, multiple solder balls 10 serving as external electrodes are attached. The surfaces of the connection pads 8 and lands 9 may be coated with, for example, an Ni/Au plating layer.

The semiconductor chip 11 is mounted on (bonded to) one surface of the wiring substrate 2 via an adhesive layer 12, which is, for example, a DAF (Die Attached Film). The semiconductor chip 11 is mounted on one surface of the wiring substrate 2 such that the center C of the semiconductor chip 11 is located offset to be closer to the end side of wiring substrate 2 on the gate side G than to the end side of wiring substrate 2 on the air-vent side A.

The semiconductor chip 11 is of an almost rectangular plate-like shape, and carries multiple electrode pads 13 formed on its one surface. The multiple electrode pads 13 are arranged along the four sides of the semiconductor chip 11 and are connected internally to a given circuit, such as a memory circuit. The multiple connection pads 8 encircle the semiconductor chip 11 along its periphery. The electrode pads 13 are electrically connected to the connection pads 8 via multiple wires 14 made of Au, Ag, Cu, or an alloy of them.

On the one surface of the wiring substrate 2, the sealing resin layer 15 is formed, which is made of a filler-containing thermosetting epoxy resin. The semiconductor chip 11 and the wires 14 are covered with the sealing resin layer 15.

Effects (4) to (8) offered by the semiconductor device 1 according to a first embodiment will be described as the effects are compared with related techniques (1) to (3).

(1) A sealing resin with a low filler content ratio has a large linear expansion coefficient (shows a large expansion rate when curing). A sealing resin with a high filler content ratio, on the other hand, has a small linear expansion coefficient (shows a small expansion rate when curing).

(2) In a sealing resin layer formed through flowable injection of a sealing resin by the general transfer molding method, the filler content ratio on the air-vent side becomes inevitably higher than the same on the gate side (see a filler content ratio indicator shown on the upper part of FIG. 2).

(3) Such a difference in filler content ratio results in different linear expansion coefficients in different areas of the sealing resin layer, thus causing a warp of the semiconductor device.

(4) According to the semiconductor device 1 of the first embodiment, the semiconductor chip 11 is mounted on the wiring substrate 2 such that the center C of the semiconductor chip 11 is located offset to be closer to the end of wiring substrate 2 on the gate side G than to the end of wiring substrate 2 on the air-vent side A.

(5) As a result of this offset mounting of the semiconductor chip 11, in the sealing resin layer 15, the occupation area of the semiconductor chip 11 increases on the gate side G and decreases on the air-vent side A.

(6) As a result, in the sealing resin layer 15, the resin content decreases in the area on the gate side G and increases in the area on the air-vent side A. This reduces an expansion rate difference between the gate side G and the air-vent side A of the sealing resin layer 15, thus reducing a warpage of the semiconductor device 1.

(7) In other words, by locating the semiconductor chip 11 offset to be closer to the gate side G, a difference in the size of filler content ratio that inevitably arises in the sealing resin layer 15 is compensated, as a result of which a difference in the size of expansion rate on the wiring substrate 2 can be reduced as much as possible.

(8) The semiconductor device 1 with less warping offers improved primary and secondary mountability and better reliability.

An example of a manufacturing method for the semiconductor device 1 of FIGS. 1 and 2 will then be described, referring to FIGS. 3A to 3F. Processes included in the manufacturing method may be executed simultaneously or in switched order.

Figure 3C:
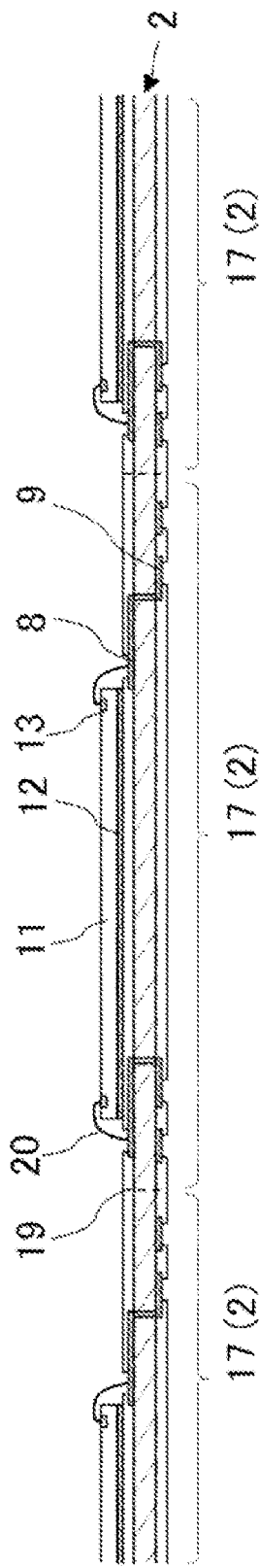
Figure 4:
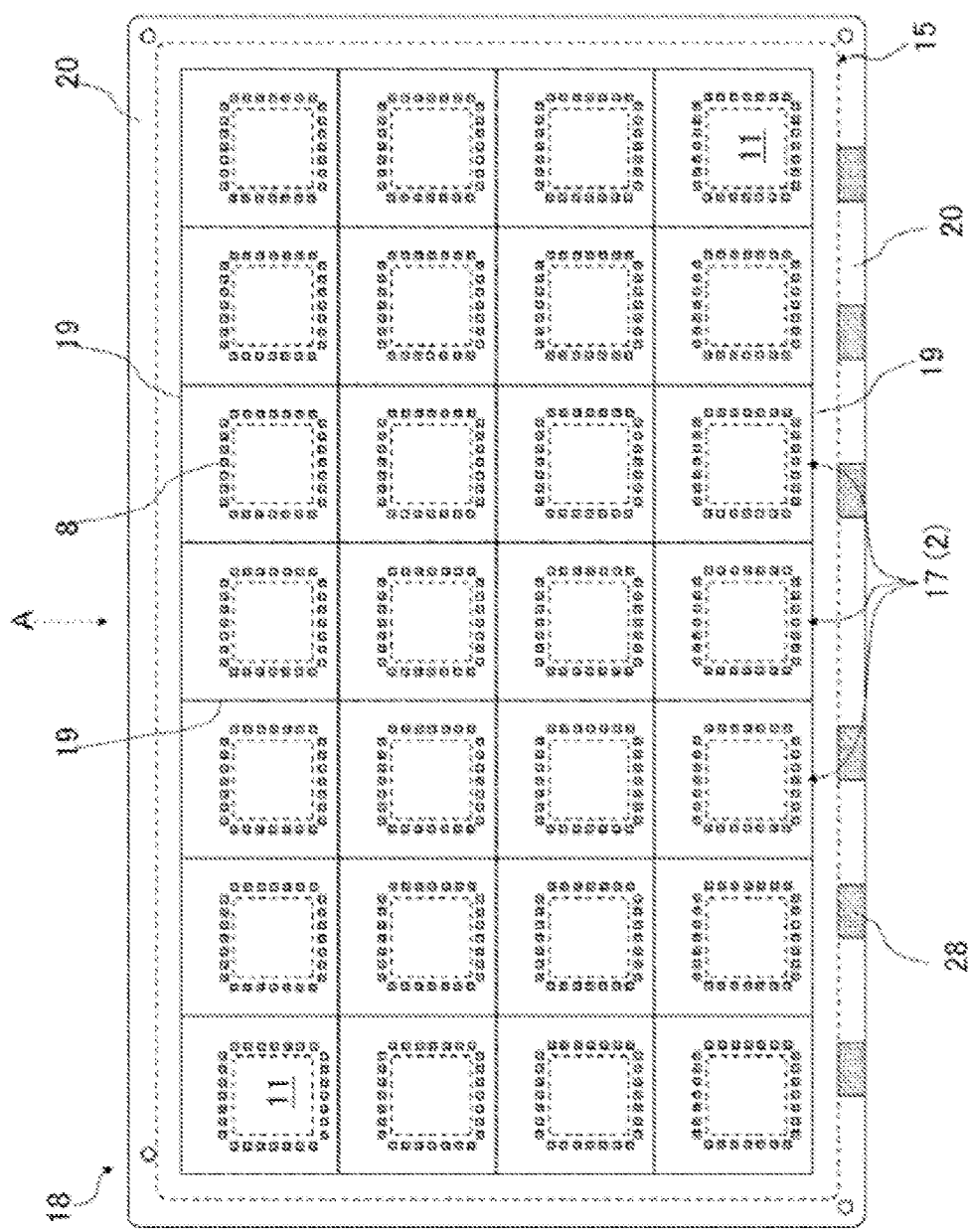
FIG. 4 is a process drawing for explaining a die bonding process shown in FIG. 3B, showing a plan view for explaining the mounting locations of multiple semiconductor chips on a wiring motherboard.

As shown in FIGS. 3A and 4, a wiring motherboard 18 having multiple product regions 17 is prepared. Each of the multiple product regions 17 is the portion that is to be processed into the wiring substrate 2 of FIG. 1. At least one semiconductor chip 11 is mounted in each of the product regions 17. On the wiring motherboard 18, the product regions 17 are arranged into a matrix formation and are demarcated by multiple dicing lines 19.

On the wiring motherboard 18, a frame 20 is formed outside the product regions 17. To ensure the release of a sealing resin from a runner 27 after the molding process, metal patterns are formed on the parts of frame 20 that correspond to gates 28. The wiring motherboard 18 configured in such a manner is sent to a die bonding process.

As shown in FIG. 3B, multiple semiconductor chips 11 are prepared, each of which has multiple electrode pads 13 formed on its one surface and an insulating adhesive layer 12, such as DAF, pasted on the other surface.

The wiring motherboard 18 is set on a stage of a die bonding apparatus (not depicted) such that the other surface of the wiring motherboard 18 is held on the stage. With its one surface sucked and held by a suction collet of the die bonding apparatus (not depicted), the semiconductor chip 11 is carried to an offset location in the product region 17, where the semiconductor chip 11 is mounted on (bonded to) the wiring substrate 2 via the adhesive layer 12. This die bonding process is executed in the same manner in each of the multiple product regions 17. Hence, in each of the product regions 17, at least one semiconductor chip 11 is mounted in the location offset to the center of the product region 17 and closer to one side.

In a transfer molding process, which will be described later, the sealing resin layer 15 that seals the semiconductor chips 11 therein is formed on the wiring substrate 2 by supplying a filler-containing resin to the side to which the offset semiconductor chip 11 is closer and discharging air from the opposite side (supplying the filler-containing resin from the one side to the multiple product regions 17 to form the sealing resin layer 15 that collectively seals the multiple semiconductor chips 11 therein on the wiring motherboard 18).

In other words, the semiconductor chip 11 is mounted in each product region 17 such that the center C of the semiconductor chip 11 is located closer to a dicing line 19 on the gate side G among multiple dicing lines 19 demarcating the product region 17. As a result, in each product region 17, the occupation rate of the semiconductor chip 11 is higher in the area on the gate side G than in the area on the air-vent side A. It is preferable that the extent of offset location of the semiconductor chips 11 be determined according to a difference in filler content ratio between the gate side and the air-vent side in the sealing resin layer 15. The wiring motherboard 18 having all semiconductor chips 11 mounted in all product regions 17, respectively, is sent to a wire bonding process.

As shown in FIG. 3C, by the wire bonding process, multiple connection pads 8 are electrically connected to multiple electrode pads 13 via multiple wires 14. In the wire bonding process, using a wire bonding apparatus (not depicted), for example, the front end of each wire 14 is melted to form a ball, which is then connected to each electrode pad 13 by ultrasonic thermal bonding, etc. The wire 14 is then lead to the connection pad 8 while describing a looped track and has its rear end connected to the connection pad 8 by ultrasonic thermal bonding, etc. The wiring motherboard 18 with every wire 14 bonded is sent to a molding process.

Figure 3D:
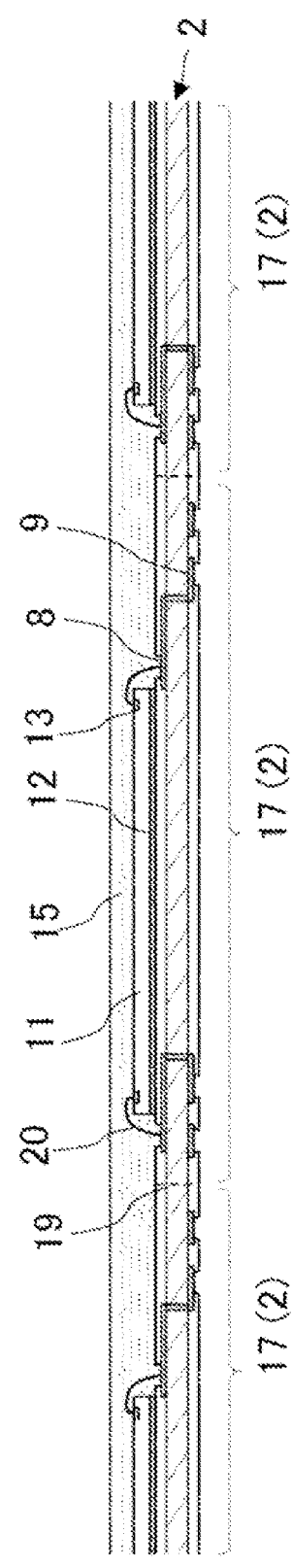

As shown in FIG. 3D, by the molding process, the sealing resin layer 15 is so formed on one surface of the wiring motherboard 18 having multiple product regions 17 that the sealing resin layer 15 collectively covers the multiple semiconductor chips 11 and wires 14. The sealing resin layer 15 is made of, for example, a thermosetting epoxy resin, which contains a filler, such as silica and alumina. The epoxy resin may be replaced with other types of resins containing the filler, such as phenol, polyimide, and silicone.

The molding process of FIG. 3D will be described in detail, referring to FIGS. 5A to 5D.

Figure 5A:
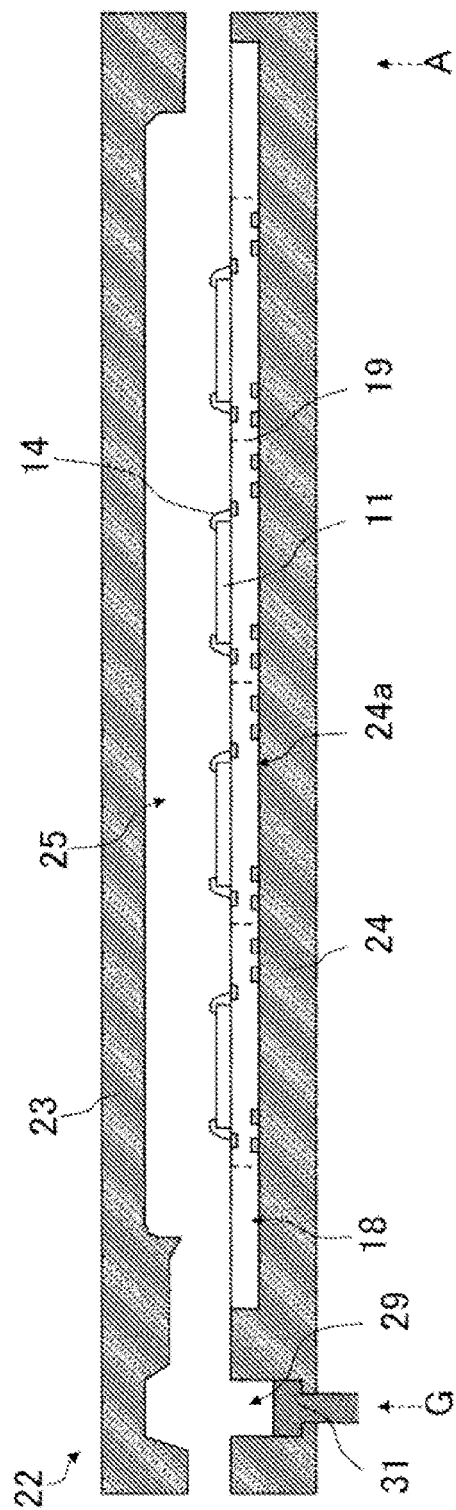
FIG. 5A to 5D are process drawings for explaining a molding process shown in FIG. 3D in detail.

As shown in FIG. 5A, a transfer molding apparatus 22 has a molding die (23, 24) including an upper die 23 and a lower die 24. A cavity 25 is formed on the upper die 23. A recession 24a housing the wiring motherboard 18 therein is formed on the lower die 24. The wiring motherboard 18 having been subjected to the wire bonding process is set in the recession 24a such that the end of wiring motherboard 18 on which the gate metal patterns are formed faces a gate 28 formed on the upper die 23.

Figure 5B:
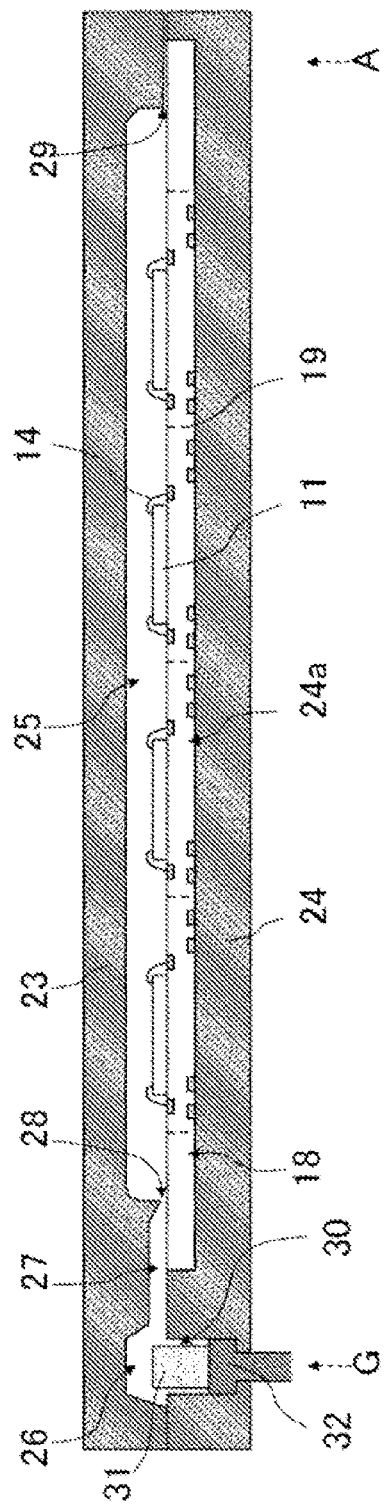

As shown in FIG. 5B, the wiring motherboard 18 is clamped between the upper die 23 and the lower die 24. As a result, a cull 26, a runner 27, the gate 28, the cavity 25, and an air vent 29 are formed above one surface of the wiring motherboard 18. A resin tablet 31 is supplied to a pot 30 of the lower die 24. The resin tablet 31 in the pot 30 is melted by heat from a heater, etc. (not depicted).

Figure 5C:
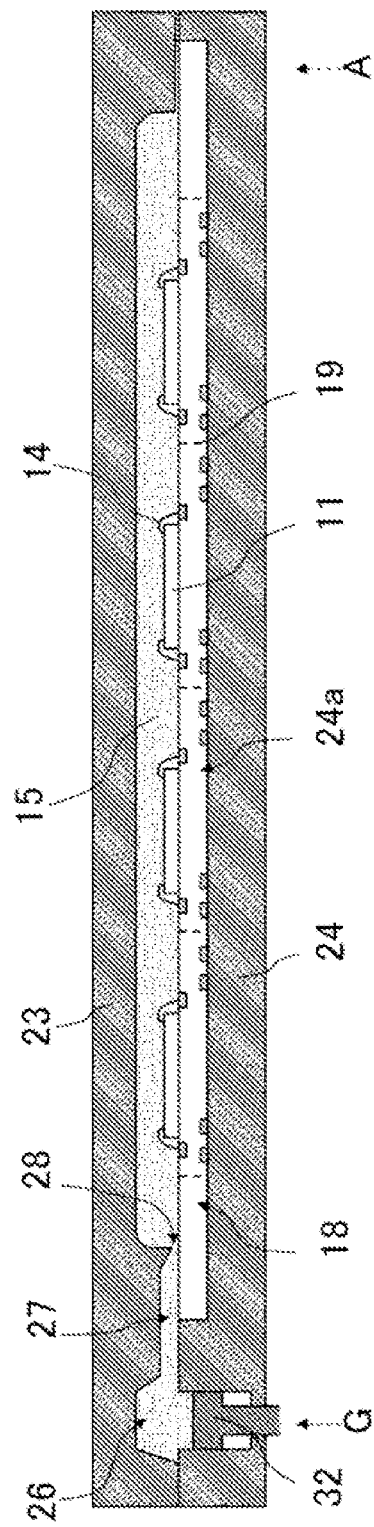

As shown in FIG. 5C, a plunger 32 is pushed out to force the melted resin material 31 through the runner 27, thereby inject the melted resin material 31 from the gate 28 into the cavity 25. After filling up the cavity 25, the resin material 31 is molded under a given temperature, such as 175° C. to thermally cure the resin material 31 into the sealing resin layer 15 in semi-cured state. Subsequently, the wiring motherboard 18 is released from the mold-clamped condition and is removed from the molding die (23, 24).

Figure 5D:
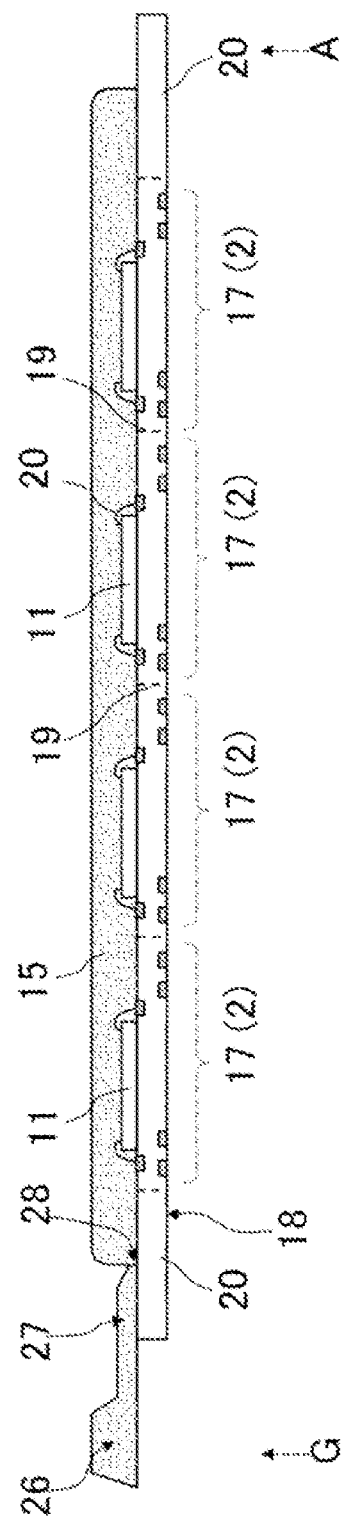
Figure 6:
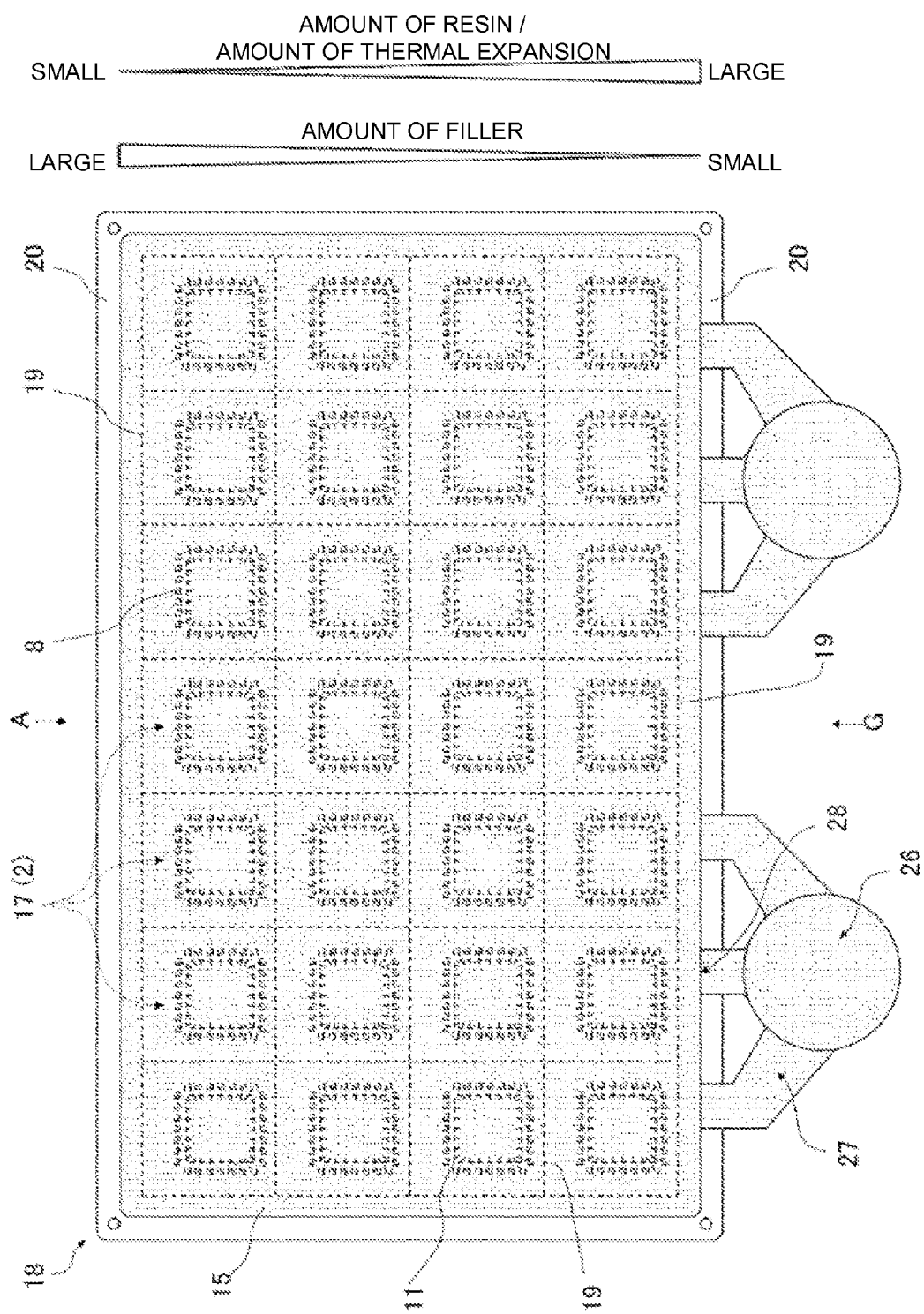
FIG. 6 is a plan view of a schematic configuration of a sealing resin layer shown in FIG. 5D that is formed through a single collective process.

As shown in FIGS. 5D and 6, the sealing resin layer 15 collectively covering the multiple product regions 17 is formed on the wiring motherboard 18. The sealing resin layer 15 is subjected to a gate-break process by which its portions corresponding to the cull 26, runner 27, gate 28, and air vent 29 are removed. Subsequently, the wiring motherboard 18 is put in a baking furnace in which the wiring motherboard 18 is subjected to an after-cure process for a given time under a given temperature, such as 175° C., to fully cure the sealing resin layer 15. Hence the sealing resin layer 15 of FIG. 3D collectively covering the product regions 17 of the wiring motherboard 18 is formed.

In general, according to the transfer molding method, the filler-containing sealing resin pressurized with the plunger is injected into the cavity of the molding die in the direction of sending the sealing resin from one side (gate side) of the wring motherboard to the other side (air-vent side) opposite to the one side. As a result, a greater portion of the filler contained in the sealing resin flows to the air-vent side and therefore the filler contents on the air-vent side becomes larger than the filler content on the gate side. This one-sided filler distribution leads to a condition where in the sealing resin layer, the resin content becomes larger on the area on the gate side in which the filler content is smaller, thus creating a larger expansion rate on that area, as the resin content becomes smaller on the area on the air-vent side in which the filler content is larger, thus creating a smaller expansion rate on that area.

According to the first embodiment, however, the semiconductor chip 11 is mounted offset in the product region 17 such that the center C of the semiconductor chip 11 is located closer to the dicing line 19 on the gate side G than to the dicing line 19 on the air-vent side A among multiple dicing lines 19 demarcating one product region 17. As a result, in the product region 17, the rate of an area occupied by the semiconductor chip 11 is higher in the area on the gate side G than in the area on the air-vent side A. In this manner, the occupation rate of the semiconductor chip 11 is larger in the area on the gate side G where the resin content is large in the conventional case. This reduces the resin content in the area on the gate side G, thereby reduces the expansion rate in the area on the gate side G. In contrast, the occupation rate of the semiconductor chip 11 is smaller in the area on the air-vent side A where the resin content is small in the conventional case. This increases the resin content in the area on the air-vent side A, thereby increases the expansion rate in the area on the air-vent side A. In this manner, the expansion rate balance between the area on the gate side G and the area on the air-vent side A is improved on the wiring substrate 2 or wiring motherboard 18 and in the sealing resin layer 15. As a result, a warpage of the semiconductor device 1 is reduced.

Figure 3E:
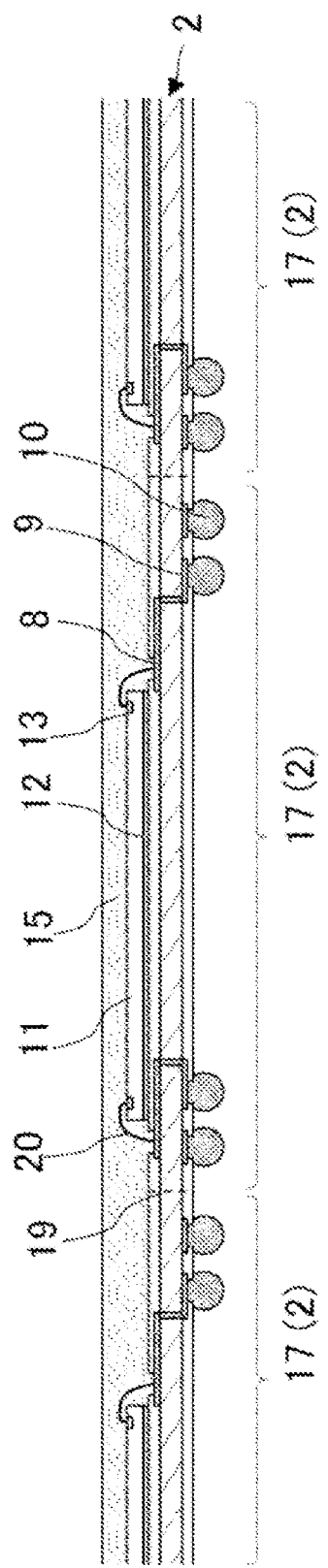

As shown in FIGS. 3D and 3E, the wiring motherboard 18 with the sealing resin layer 15 formed thereon is sent to a ball mounting process. As shown in FIG. 3E, by the ball mounting process, multiple solder balls 10 serving as external electrodes are attached to multiple lands 9 arranged on the other side of the wiring motherboard 18 (in the product regions 17). For example, using a suction mechanism (not depicted) having multiple suction holes formed in correspondence to the land arrangement, the solder balls 10, which are solder metal balls, etc., are held stuck to the suction holes, and flux is transferred to the solder balls 10, which are then attached collectively to the lands 9. After every solder ball 10 is attached to every land 9, the wiring motherboard 18 is subjected to a solder-reflow process at a given temperature to form multiple external electrodes 10 made of the solder balls 10. The wiring motherboard 18 carrying the external electrodes 10 is sent to a substrate dividing process.

Figure 3F:
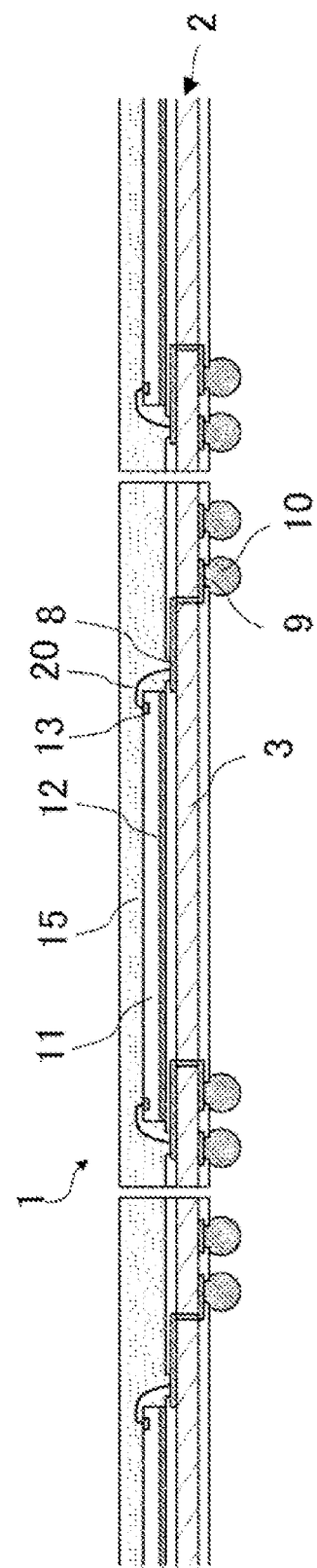

As shown in FIG. 3F, by the substrate dividing process, the wiring motherboard 18 carrying the external electrodes 10 is diced along the dicing lines 19, using a dicing apparatus (not depicted), into individual separate pieces corresponding to the product regions 17, respectively.

For example, the sealing resin layer 15 pasted/fixed to a dicing tape (not depicted) is cut with a high-speed rotating dicing blade of the dicing apparatus (not depicted) along the dicing lines 19. Subsequently, individual pieces of wiring substrates 2 are picked from the dicing tape to obtain the multiple semiconductor devices 1 of FIGS. 1 and 2.

According to the manufacturing method for the first embodiment, by disposing the semiconductor chip 11 in the offset location closer to the gate side G, the semiconductor device 1 with less warping can be manufactured without adopting an additional process or equipment. By reducing a warpage of the wiring motherboard 18, a problem with transfer of the wiring motherboard 18 caused by its warpage is prevented in a post-molding process. Hence the productivity of the semiconductor device 1 is improved.

Second Embodiment

A second embodiment will be described by paying attention to differences between the second embodiment and the first embodiment, and aspects common to both embodiments will be mentioned by referring to the description of the first embodiment on a necessary basis.

Figure 7:
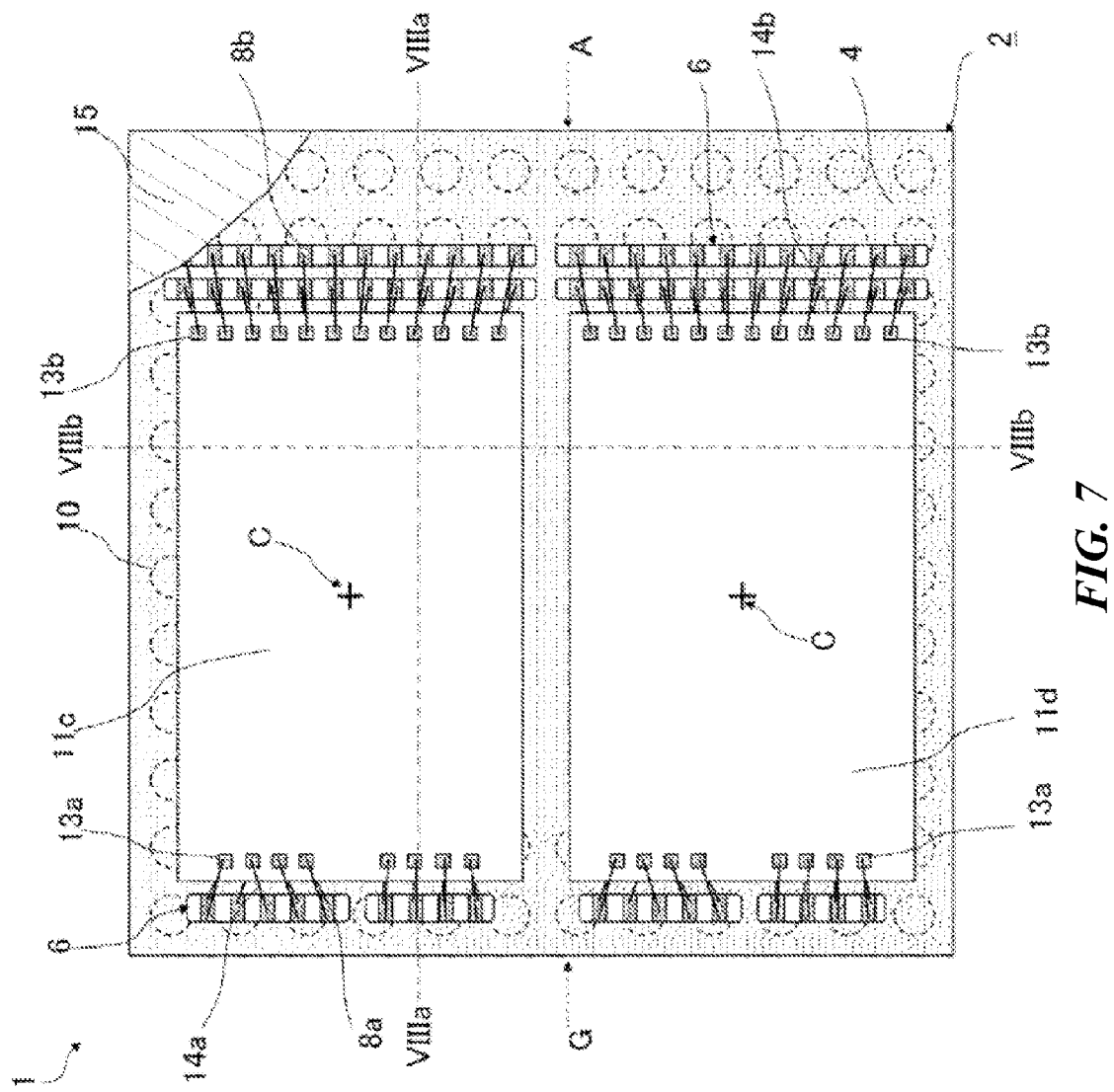
FIG. 7 is a plan view of a schematic configuration of a semiconductor device according to a second embodiment.
Figure 8A:
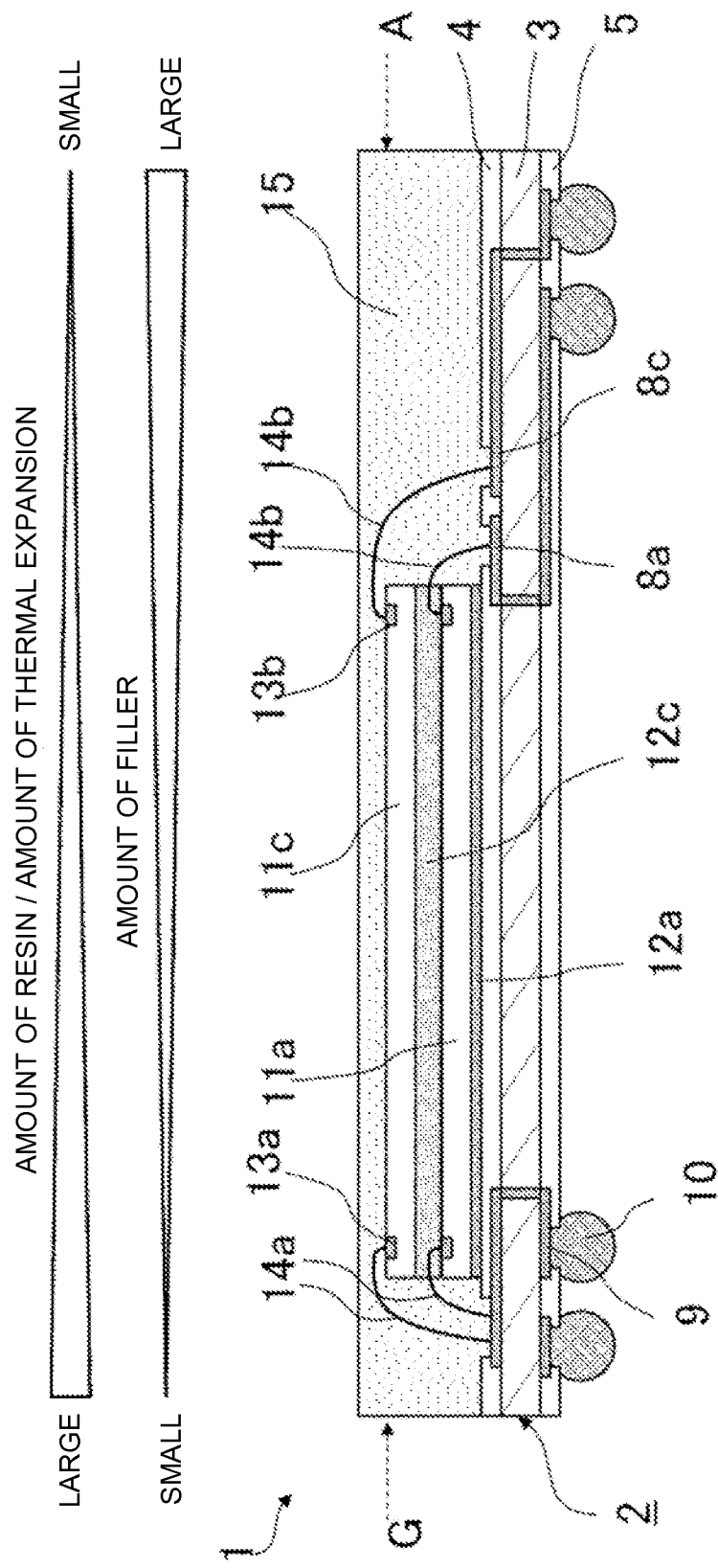
FIG. 8A is a sectional view along a VIIIa-VIIIa line of FIG. 7.
Figure 8B:
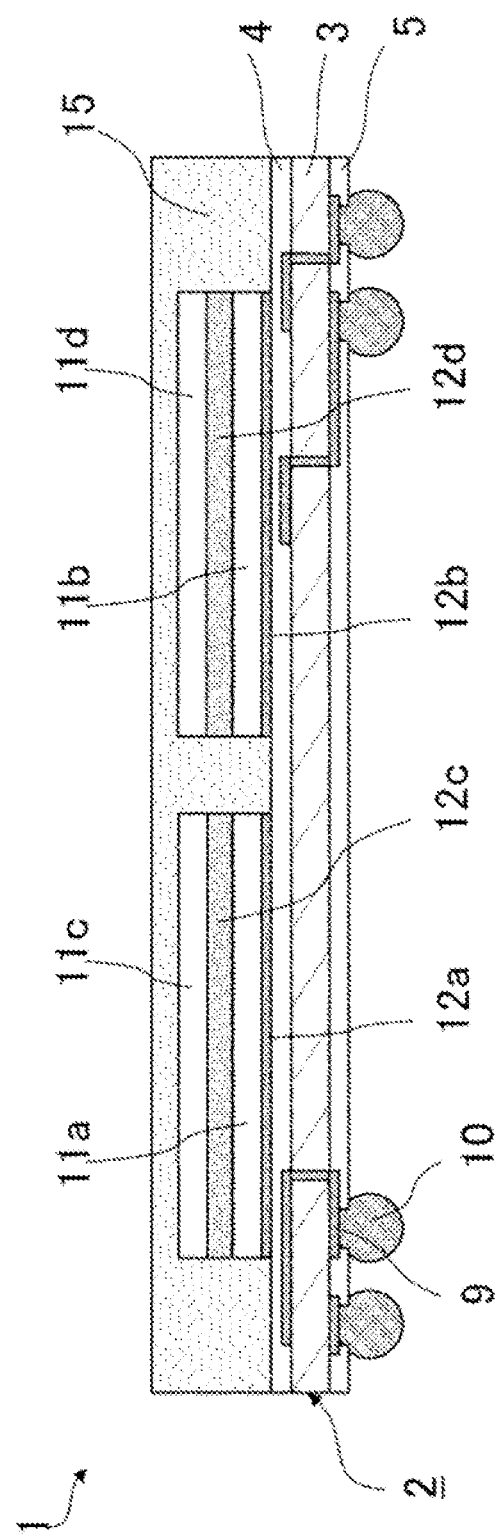
FIG. 8B is a sectional view along a VIIIb-VIIIb line of FIG. 7.

As shown in FIGS. 7, 8A, and 8B, the semiconductor device 1 of the second embodiment is an MCP (Multichip Package) type semiconductor device and is different from the semiconductor device 1 of the first embodiment in electrode pad arrangement and in that first to fourth semiconductor chips 11a to 11d are mounted on one wiring substrate 2.

On the wiring substrate 2, the first and second semiconductor chips 11a and 11b are juxtaposed so that their long sides are opposed to each other. The first and second semiconductor chips 11a and 11b are bonded to a dielectric layer 4 on the wiring substrate 2 via first and second adhesive layers (e.g., DAF (Die Attached Film)) 12a and 12b, respectively.

The third and fourth semiconductor chips 11c and 11d are stacked over the first and second semiconductor chips 11a and 11b via third and fourth adhesive layers (e.g., FOW (Film on Wire)), respectively. The third and fourth semiconductor chips 11c and 11d are so stacked that they are almost completely superposed on the first and second semiconductor chips 11a and 11b. The third and fourth semiconductor chips 11c and 11d, therefore, are also juxtaposed so that their long sides are opposed to each other.

On each of the first to fourth semiconductor chips 11a to 11d, multiple first and second pads 13a and 13b are arranged along opposed short sides of the semiconductor chip. On one surface of the wiring substrate 2, multiple connection pads 8a and 8b are arranged along opposed short sides of each of the first to fourth semiconductor chips 11a to 11d. The multiple first and second pads 13a and 13b are connected to the corresponding multiple connection pads 8a and 8b via multiple first and second wires 14a and 14b.

The first electrode pads 13a, first wires 14a, and first connection pads 8a are arranged in the area on the gate side G. The second electrode pads 13b, second wires 14b, and second connection pads 8b are arranged in the area on the air-vent side A.

On each of the first to fourth semiconductor chips 11a to 11d, the number of the first electrode pads 13a arranged along one short side (which is faced to the gate side G during the molding process) is smaller than the number of the second electrode pads 13b arranged along the other short side (which is faced to the air-vent side A during the molding process). Similarly, the number of the first wires 14a on the gate side G is smaller than the number of the second wires 14b on the air-vent side A. Similarly, the number of the first connection pads 8a on the gate side G is smaller than the number of the second connection pads 8b on the air-vent side A.

On the other surface of the wiring substrate 2, a second dielectric layer 5 is formed. The solder balls 10 are attached to the lands 9 exposed through multiple openings formed on the second dielectric layer 5. The connection pads 8 are electrically connected to the lands 9 via conductors in the wiring substrate 2. On one surface of the wiring substrate 2, the sealing resin layer 15 is formed out of the filler-containing epoxy resin, and the first to fourth semiconductor chips 11a to 11d and the first and second wires 14a and 14b are covered with the sealing resin layer 15.

According to the second embodiment, in the same manner as in the first embodiment, each of the first to fourth semiconductor chips 11a to 11d is mounted on the one surface of the wiring substrate 2 such that the center C of the semiconductor chip is located offset to be closer to the end side of wiring substrate 2 on the gate side G than to the end side of the same on the air-vent side A. In addition, each of the first to fourth semiconductor chips 11a to 11d is mounted such that the first electrode pads 13a less in number are arranged on the gate side G as the second electrode pads 13b greater in number are arranged on the air-vent side A.

The semiconductor device 1 of the second embodiment offers the same effect as offered by the first embodiment. The semiconductor device 1 of the second embodiment also offers the following effects.

By facing the side of each of the first to fourth semiconductor chips 11a to 11d that carry the electrode pads in greater number to the air-vent side A, on the wiring substrate 2, a sufficient wiring space is secured in the vicinity of the side carrying the electrode pads in greater number, which facilitates wire arrangement. By mounting the multiple semiconductor chips 11a to 11d on the wiring substrate 2, the function of the semiconductor device 1 is improved or the capacity of the semiconductor device 1 is increased.

Third Embodiment

A third embodiment will be described by paying attention to differences between the third embodiment and the first embodiment, and aspects common to both embodiments will be mentioned by referring to the description of the first embodiment on a necessary basis.

Figure 9:
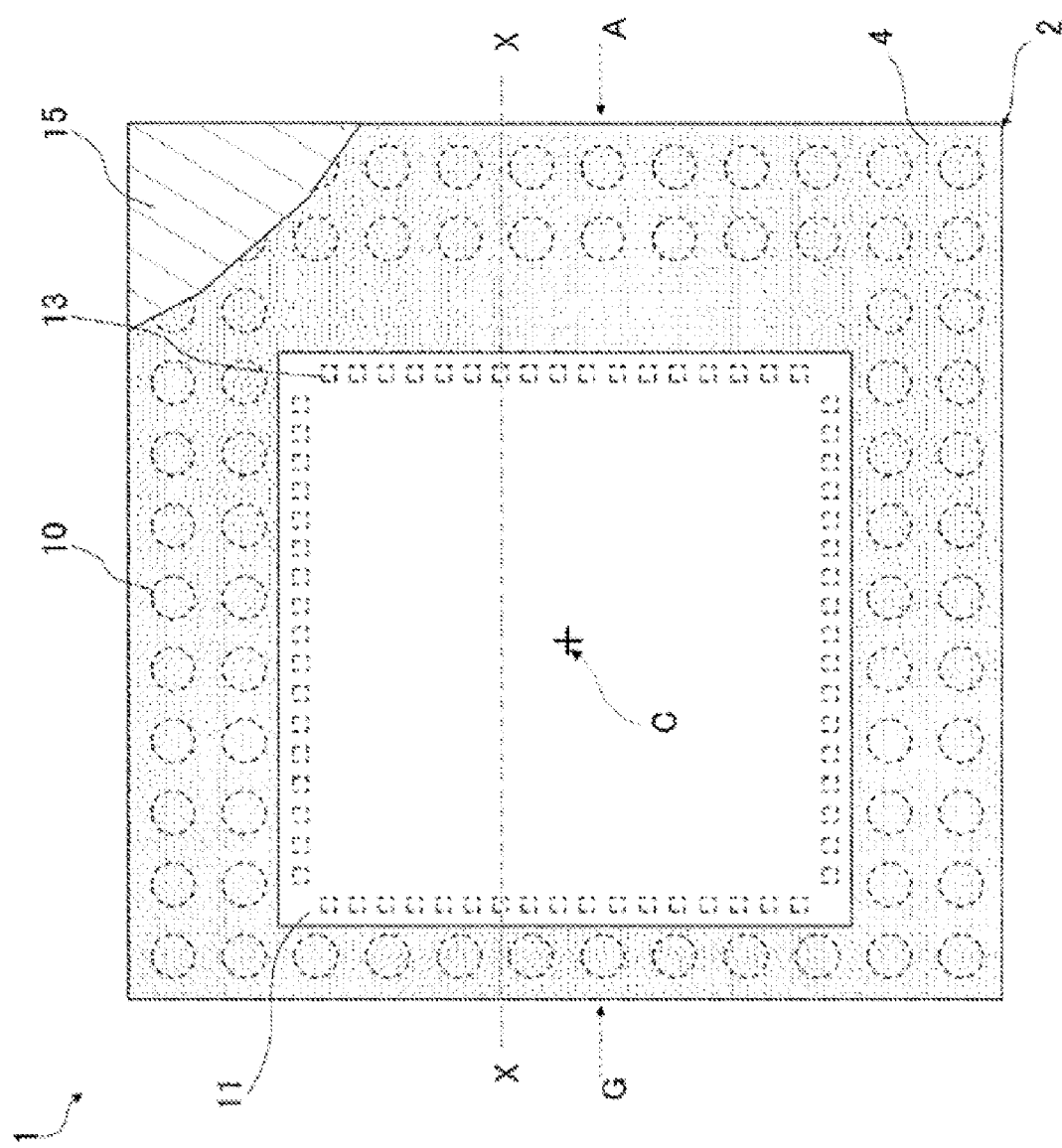
FIG. 9 is a plan view of a schematic configuration of a semiconductor device according to a third embodiment.
Figure 10:
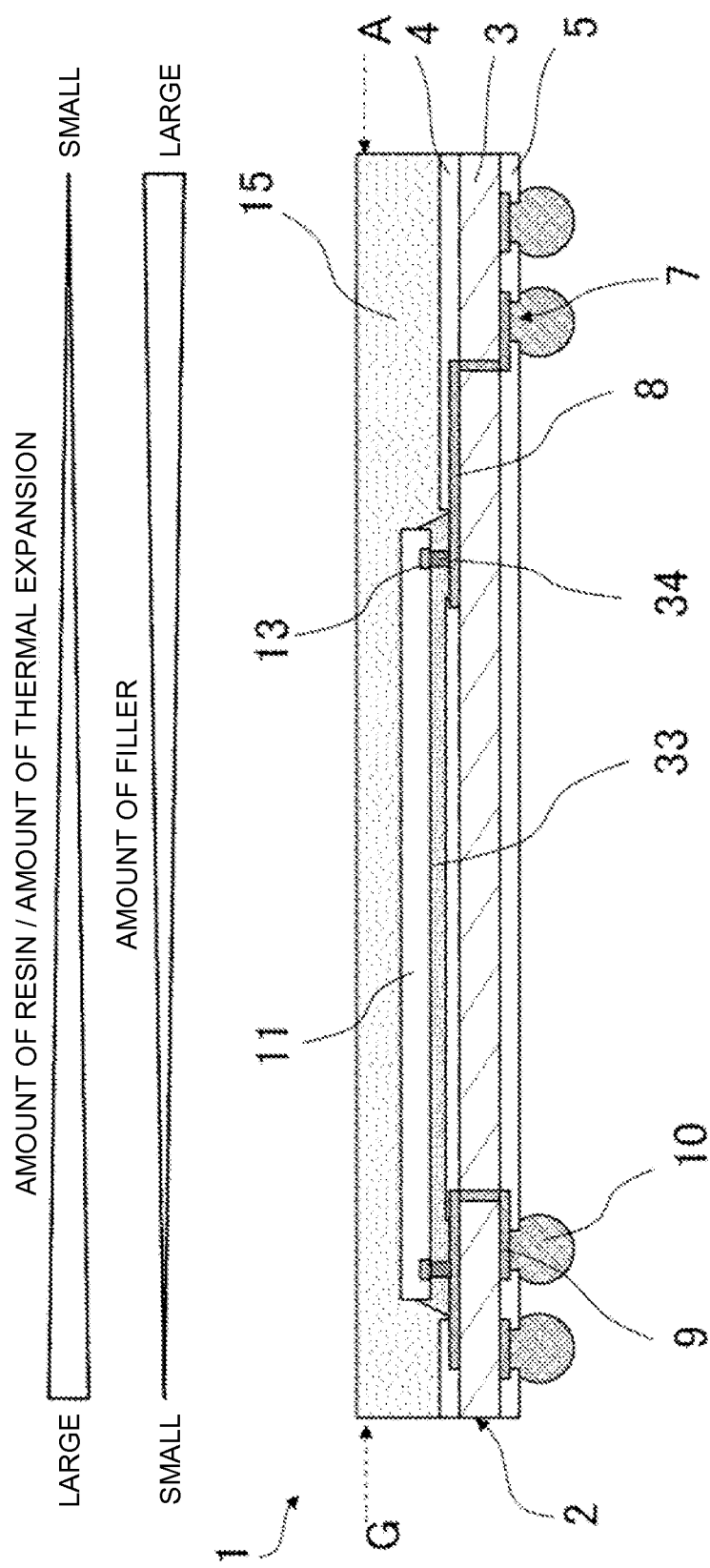
FIG. 10 is a sectional view along a X-X line of FIG. 9.

As shown in FIGS. 9 and 10, according to the semiconductor device 1 of the third embodiment, multiple electrode pads 13 are formed on a surface of semiconductor chip 11 that faces the wiring substrate 2. The multiple electrode pads 13 are connected to multiple lands 9 and to multiple solder balls (external electrodes) 10 via multiple bump electrodes 34. A gap between the semiconductor chip 13 and the wiring substrate 2 is filled with an under-filling material 33.

The semiconductor device 1 of the third embodiment offers the same effect as offered by the first embodiment. The semiconductor chip 11 mounted in a flip-chip structure leads to an improvement in the electrical characteristics of the semiconductor device 1 and a reduction in the thickness of the semiconductor device 1.

The present invention made by the inventor has been described based on the embodiments. The present invention is not limited to the above embodiments but may be modified into various forms of applications on the condition that the modification does not deviate from the substance of the invention. For example, the wiring substrate of the present invention may be selected properly out of a rigid wiring substrate made of glass epoxy, a flexible wiring substrate made of polyimide, etc., and a wiring substrate having properties between the rigidness and flexibility of those wiring substrates. The semiconductor chip of the present invention may be selected properly out of a memory chip, a logic chip, and other types of chips. The semiconductor chips mounted on the wiring substrate may be identical or different in configuration with or from each other. In the second embodiment, the semiconductor device including four semiconductor chips made up of two pairs of stacked semiconductor chips arranged next to each other is described. If each semiconductor chip is mounted such that its center is located offset to be closer to the end of wiring substrate on the gate side, the number of stacked semiconductor chips and the form of stacking semiconductor chips may be determined freely.

CONCLUSION

In one embodiment, there is provided a semiconductor device comprising: a substrate including a first substrate side and a second substrate side opposite to the first substrate side; a first semiconductor chip including a first chip side and a second chip side opposite to the first chip side, the first semiconductor chip being mounted over the substrate to define a first area between the first substrate side and the first chip side and a second area between the second substrate side and the second chip side, the first area being larger than the second area; and a sealing layer including a resin and a filler therein, the sealing layer over the substrate and the first semiconductor chip to include a first part covering the first area and a second part covering the second area, and the first part being larger in content ratio of the filler to the resin than the second part.

In another embodiment, there is provided a semiconductor device comprising: a first semiconductor chip; and a sealing layer covering the first semiconductor chip, the sealing layer including a resin and a filler therein, the sealing layer having a first side and a second side opposite to the first side, the first side of the sealing layer being larger in content ratio of the filler to resin than the second side of the sealing layer, wherein a center of the first semiconductor chip is deviated to a direction extending from a center of sealing layer toward the second side of the sealing layer.

In yet another embodiment, there is provided a semiconductor device comprising: a sealing layer including a resin and a filler therein, the sealing layer having a first side and a second side opposite to the first side, the second side of the sealing layer being larger in content ratio of the filler to the resin than the first side of the sealing resin; a first semiconductor chip embedded in the sealing layer, a distance between a center of the first semiconductor chip and the first side of the sealing layer being larger than a distance between the center of the first semiconductor chip and the second side of the sealing layer; and a second semiconductor chip embedded in the sealing layer, a distance between a center of the second semiconductor chip and the first side of the sealing layer being larger than a distance between the center of the second semiconductor chip and the second side of the sealing layer, and the second semiconductor chip being apart from the first semiconductor chip.

APPENDANT

Appendant 1, Fourth Aspect

A semiconductor device comprising:
a wiring substrate including a first end (end side) and a second end (end side) opposite to the first end;
a semiconductor chip mounted on the wiring substrate; and
a sealing resin layer containing a filler, the sealing resin layer being so formed on the wiring substrate as to cover the semiconductor chip, wherein
in the sealing resin layer, a filler content is larger in vicinity of the first end of the wiring substrate than in vicinity of the second end of the wiring substrate, and an occupation rate of a semiconductor chip is larger in the vicinity of the second end of the wiring substrate than in the vicinity of the first end of the wiring substrate.

Appendant 2, Fifth Aspect

A semiconductor device comprising:
a wiring substrate including a gate side end (end side) and an air-vent side end (end side) opposite to the gate side end;
a semiconductor chip mounted on one surface of the wiring substrate such that the semiconductor chip is located closer to the gate side end than to the air-vent side end; and
a sealing resin layer so formed on the one surface of the wiring substrate as to cover the semiconductor chip.

Appendant 3, Sixth Aspect

A manufacturing method for a semiconductor device comprising the steps of:
preparing a wiring substrate having at least one product region demarcated by a plurality of dicing lines;
mounting at least one semiconductor chip in at least the one product region such that the semiconductor chip is located closer to one of the dicing lines closer to one end than to the other of the dicing lines closer to the other end; and
injecting a sealing resin from the dicing line closer to the one end toward the dicing line closer to the other end to form a sealing resin layer covering at least the one semiconductor chip.

Configurations preferable in the first to sixth aspects will be described below.

Appendant 4

The sealing resin layer contains the filler. In the sealing resin layer, the filler content is larger in the vicinity of the air-vent side end of the wiring substrate than in the vicinity of the gate side end of the wiring substrate.

Appendant 5

On the wiring substrate, the semiconductor chip is located offset to be closer to the end where a filler content ratio in the sealing resin layer is relatively low and is sealed in its offset location.

Appendant 6

The sealing resin layer is formed by pressure-transferring the filler-containing resin from one side while discharging air from the other side. An area where a filler content ratio is relatively low is formed on the one side, i.e., pressure-transfer side (gate side), while an area where the filler content ratio is relatively high is formed on the other side, i.e., air-discharge side (air-vent side).

Appendant 7

The above offset mounting of the semiconductor chip relatively increases the chip occupation rate in the area where the filler content ratio in the sealing resin layer becomes relatively low.

Appendant 8

The semiconductor chip is disposed such that its side carrying electrode pads in greater number is faced to the area where the filler content ratio is relatively high, i.e., the air-vent side.

Appendant 9

The semiconductor chip is connected to the wiring substrate in a wire-bonding structure or flip-chip structure.

Appendant 10

The wiring substrate has at least one product region in which the multiple semiconductor chips are mounted. In the product region, each of the semiconductor chips is mounted such that the semiconductor chip is located offset to be closer to the area where the filler content ratio in the sealing resin layer is relatively low and is sealed in its offset location in the sealing resin layer.

Appendant 11

The wiring substrate has multiple product regions in each of which at least one semiconductor chip is mounted. In each of the product regions, each of the semiconductor chips is mounted such that the semiconductor chip is located offset to be closer to the area where the filler content ratio in the sealing resin layer is relatively low and is sealed in its offset location in the sealing resin layer.

Appendant 12

One side of a mold is provided with at least one gate through which the filler-containing resin is supplied into the mold. The other side of the mold is provided with at least one air vent from which air is discharged. The semiconductor chip is located offset to be closer to the gate side and is bonded to the wiring substrate.

Appendant 13

The side of semiconductor chip that carries electrode pads in greater number is located closer to the air-vent side.

Appendant 14

The wiring substrate has multiple product regions in each of which at least one semiconductor chip is mounted. In each of the product regions, each of the semiconductor chips is bonded in an offset location closer to the gate side.

Within the scope of the present invention fully disclosed herein (including the claims and drawings), the embodiments and examples may be modified or altered based on the basic technical concept of the invention. Within the scope of the claims of the present invention, various disclosed elements (including elements of individual claims, embodiments, examples, and drawings) may be combined and selected in various manners. It is therefore obvious that the present invention includes various modifications and alterations that those who are skilled in the art will be able to make according to the entire disclosed elements and technical concept including the claims and drawings. It should be understood that numerical values and their ranges described in this specification include any given intermediate values, smaller values, and smaller ranges even if such values and ranges are not specified clearly.

What is claimed is:

1. A semiconductor device comprising:
    a substrate including a first substrate side and a second substrate side opposite to the first substrate side;
    a first semiconductor chip including a first chip side and a second chip side opposite to the first chip side, the first semiconductor chip being mounted over the substrate to define a first area between the first substrate side and the first chip side and a second area between the second substrate side and the second chip side, the first area being larger than the second area; and
    a sealing layer including a resin and a filler therein, the sealing layer over the substrate and the first semiconductor chip to include a first part covering the first area and a second part covering the second area, the first part being larger in content ratio of the filler to the resin than the second part.

2. The semiconductor device as claimed in claim 1, wherein the substrate includes a plurality of connection pads thereon, and the first semiconductor chip includes a plurality of electrode pads thereon.

3. The semiconductor device as claimed in claim 2, further comprising:
    a plurality of bonding wires coupling the electrode pads of the first semiconductor chip to the connection pads of the substrate.

4. The semiconductor device as claimed in claim 2, further comprising:
    a plurality of bump electrodes coupling the electrode pads of the first semiconductor chip to the connection pads of the substrate.

5. The semiconductor device as claimed in claim 2, wherein the electrode pads include a plurality of first electrode pads arranged along the first chip side and a plurality of second electrode pads arranged along the second chip side, and the number of the first electrode pads is larger than that of the second electrode pads.

6. The semiconductor device as claimed in claim 1, further comprising:
a second semiconductor chip including a third chip side and a fourth chip side opposite to the third chip side, the second semiconductor chip being mounted over the substrate to define a third area between the first substrate side and the third chip side and a fourth area between the second substrate area and the fourth chip side, the third area being larger than the fourth area.

7. The semiconductor device as claimed in claim 6, wherein each of the first and second semiconductor chips has a rectangular shape in plan view, and
the first and second semiconductor chips are arranged so that a long side of the second semiconductor chip faces a long side of the first semiconductor chip.

8. The semiconductor device as claimed in claim 6, further comprising:
a third semiconductor chip stacked over the first semiconductor chip, the first semiconductor chip being between the substrate and the third semiconductor chip; and
a fourth semiconductor chip stacked over the second semiconductor chip, the second semiconductor chip being between the substrate and the fourth semiconductor chip.

9. The semiconductor device as claimed in claim 8, wherein each of the first and second semiconductor chips is mounted over the substrate via a first adhesive, each of the third and fourth semiconductor chip is stacked over corresponding one of the first and second semiconductor chips via a second adhesive, and the second adhesive is larger in thickness than the first adhesive.

10. A semiconductor device comprising:
a first semiconductor chip; and
a sealing layer covering the first semiconductor chip, the sealing layer including a resin and a filler therein, the sealing layer having a first side and a second side opposite to the first side, the first side of the sealing layer being larger in content ratio of the filler to the resin than the second side of the sealing layer,
wherein a center of the first semiconductor chip is deviated to a direction extending from a center of the sealing resin toward the second side of the sealing layer.

11. The semiconductor device as claimed in claim 10, further comprising:
a substrate provided over the first semiconductor chip, the first semiconductor chip being disposed between the substrate and the sealing resin, and the substrate including a plurality of connection pads thereon,
wherein the first semiconductor chip includes a plurality of electrode pads thereon.

12. The semiconductor device as claimed in claim 11, further comprising:
a plurality of bonding wires coupling the electrode pads of the first semiconductor chip to the connection pads of the substrate.

13. The semiconductor device as claimed in claim 11, further comprising:
a plurality of bump electrodes coupling the electrode pads of the first semiconductor chip to the connection pads of the substrate.

14. The semiconductor device as claimed in claim 10, further comprising:
a second semiconductor chip covered with the sealing layer, and a center of the second semiconductor chip being deviated to the first direction extending from the center of the sealing layer toward the second side of the sealing layer.

15. The semiconductor device as claimed in claim 14, wherein each of the first and second semiconductor chips has a rectangular shape in plan view, and
the first and second semiconductor chips are arranged so that a long side of the second semiconductor chip faces a long side of the first semiconductor chip.

16. The semiconductor device as claimed in claim 14, further comprising:
a third semiconductor chip stacked over the first semiconductor chip, the third semiconductor chip being covered with the sealing layer; and
a fourth semiconductor chip stacked over the second semiconductor chip, the fourth semiconductor chip being covered with the sealing layer.

17. The semiconductor device as claimed in claim 10, wherein the first semiconductor chip includes a first chip side faced to the first side of the sealing layer, a second chip side faced to the second side of the sealing layer, a plurality of first electrode pads arranged along the first chip side and a plurality of second electrode pads arranged along the second chip side, and the number of the first electrode pads is larger than that of the second electrode pads.

18. A semiconductor device comprising:
a sealing layer including a resin and a filler therein, the sealing layer having a first side and a second side opposite to the first side, the first side being larger in content ratio of the filler to the resin than the second side;
a first semiconductor chip embedded in the sealing layer, a distance between a center of the first semiconductor chip and the first side of the sealing layer being larger than a distance between the center of the first semiconductor chip and the second side of the sealing layer; and
a second semiconductor chip embedded in the sealing layer, a distance between a center of the second semiconductor chip and the first side of the sealing layer being larger than a distance between the center of the second semiconductor chip and the second side of the sealing layer, and the second semiconductor chip being apart from the first semiconductor chip.

19. The semiconductor device as claimed in claim 18, further comprising:
a third semiconductor chip embedded in the sealing layer, the third semiconductor chip being stacked over the first semiconductor chip; and
a fourth semiconductor chip embedded in the sealing layer, the fourth semiconductor chip being stacked over the second semiconductor chip.

20. The semiconductor device as claimed in claim 18, further comprising:
a plurality of external terminals coupling to each of electrode pads of the first and second semiconductor chips.

* * * * *